(12) United States Patent
Scott

(10) Patent No.: US 7,891,838 B2
(45) Date of Patent: Feb. 22, 2011

(54) HEAT SINK APPARATUS FOR SOLID STATE LIGHTS

(75) Inventor: Keith Scott, Los Gatos, CA (US)

(73) Assignee: Bridgelux, Inc., Livermore, CA (US)

( * ) Notice: Subject to any disclaimer, the term of this patent is extended or adjusted under 35 U.S.C. 154(b) by 13 days.

(21) Appl. No.: 12/165,570

(22) Filed: Jun. 30, 2008

(65) Prior Publication Data

US 2009/0323360 A1     Dec. 31, 2009

(51) Int. Cl.
*F21V 29/00* (2006.01)

(52) U.S. Cl. .................. 362/249.02; 362/800; 362/294; 362/373

(58) Field of Classification Search .................. 362/800, 362/249.02, 545, 547, 294, 373
See application file for complete search history.

(56) References Cited

U.S. PATENT DOCUMENTS

| | | | |
|---|---|---|---|
| 6,480,515 B1 | 11/2002 | Wilson | |
| 6,787,999 B2 * | 9/2004 | Stimac et al. | .................. 315/51 |
| 6,860,620 B2 | 3/2005 | Kuan et al. | |
| 7,309,145 B2 | 12/2007 | Nagata et al. | |
| 7,438,449 B2 * | 10/2008 | Lai et al. | ..................... 362/373 |
| 2001/0030866 A1 | 10/2001 | Hochstein | |
| 2004/0000677 A1 | 1/2004 | Dry | |
| 2005/0007772 A1 * | 1/2005 | Yen | ............................ 362/206 |
| 2005/0168990 A1 | 8/2005 | Nagata et al. | |
| 2007/0098334 A1 | 5/2007 | Chen | |
| 2007/0230186 A1 | 10/2007 | Chien | |
| 2007/0253202 A1 * | 11/2007 | Wu et al. | ..................... 362/294 |
| 2007/0285920 A1 | 12/2007 | Seabrook | |
| 2008/0037255 A1 * | 2/2008 | Wang | ......................... 362/294 |
| 2008/0049399 A1 | 2/2008 | Lu et al. | |
| 2008/0055909 A1 * | 3/2008 | Li | .............................. 362/294 |
| 2008/0112170 A1 | 5/2008 | Trott et al. | |

OTHER PUBLICATIONS

PCT search report of Aug. 27, 2009 of PCT/US2009049096.
U.S. Appl. No. 12/165,544, filed Jun. 30, 2008, Keith Scott.
U.S. Appl. No. 12/165,563, filed Feb. 28, 2008, Keith Scott.
U.S. Appl. No. 12/234,481, filed Sep. 19, 2008, Keith Scott.
PCT Search report of Sep. 1, 2009 for PCT/US 09/49103.
PCT Search report of Aug. 27, 2009 for PCT/US 09/49104.
PCT Search report of Aug. 27, 2009 for PCT/US 09/49099.

* cited by examiner

*Primary Examiner*—Laura Tso
(74) *Attorney, Agent, or Firm*—Haynes and Boone, LLP

(57) ABSTRACT

Embodiments of the current invention seek to increase heat dissipation by affixing a separate or integrated heat sink to the solid state light, thus accomplishing increased heat dissipation via a device different from the light, alleviating need for altering the solid state light itself. In this manner, embodiments of the invention increase the amount of heat dissipated from solid state lights without requiring any redesign of the solid state lights themselves.

15 Claims, 4 Drawing Sheets

HEAT SINK APPARATUS FOR SOLID STATE LIGHTS

BRIEF DESCRIPTION OF THE INVENTION

This invention relates generally to solid state lights. More specifically, this invention relates to heat sink apparatuses for solid state lights.

BACKGROUND OF THE INVENTION

The operational power of many current solid state lights, such as light-emitting diode (LED) lights, is often limited by the solid state lights' ability to dissipate heat. More particularly, increasing the current of a solid state light increases the amount of heat generated. Beyond a certain point, this excess heat becomes detrimental to the performance of the solid state device, resulting in reduced performance and/or operational life. Accordingly, increasing the ability of a solid state light to dissipate heat allows for higher power, and thus brighter, solid state lights. Thus, ongoing efforts exist to increase the amount of heat dissipated from solid state lights.

SUMMARY OF THE INVENTION

The invention can be implemented in a number of ways, including as an apparatus, as a device incorporating both heat sink and solid state light source, and as an assembly.

In one embodiment, a heat sink apparatus comprises a heat sink comprising a first end configured for connection to a solid state light, a second end opposite the first end, and a heat dissipating portion positioned between the first end and the second end. The heat dissipating portion has an elongated element and a plurality of fins for dissipating heat generated by the solid state light, the fins extending from the elongated element.

In another embodiment, a solid state light assembly comprises a solid state light and a heat sink affixed to the solid state light. The heat sink has at least one fin for dissipating heat generated by the solid state light.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF EMBODIMENTS OF THE INVENTION

As noted above, ongoing efforts exist to increase the heat dissipation of solid state lights. One embodiment of the current invention seeks to increase heat dissipation by affixing a separate heat sink to the solid state light, thus accomplishing increased heat dissipation via a separate, easily-attached device; a second embodiment integrates the solid state light source together with the heat sink. In this manner, embodiments of the invention increase the amount of heat dissipated from solid state lights without requiring any redesign of traditional light fixtures or lamps themselves. This has the twin benefits of increasing heat dissipation, and thus allowing increased solid state light power, while also shifting the burden of heat dissipation to a separate (possibly integrated) device, so that solid state lights can be optimized for better lighting performance, rather than for increased heat dissipation.

Figure 1A:
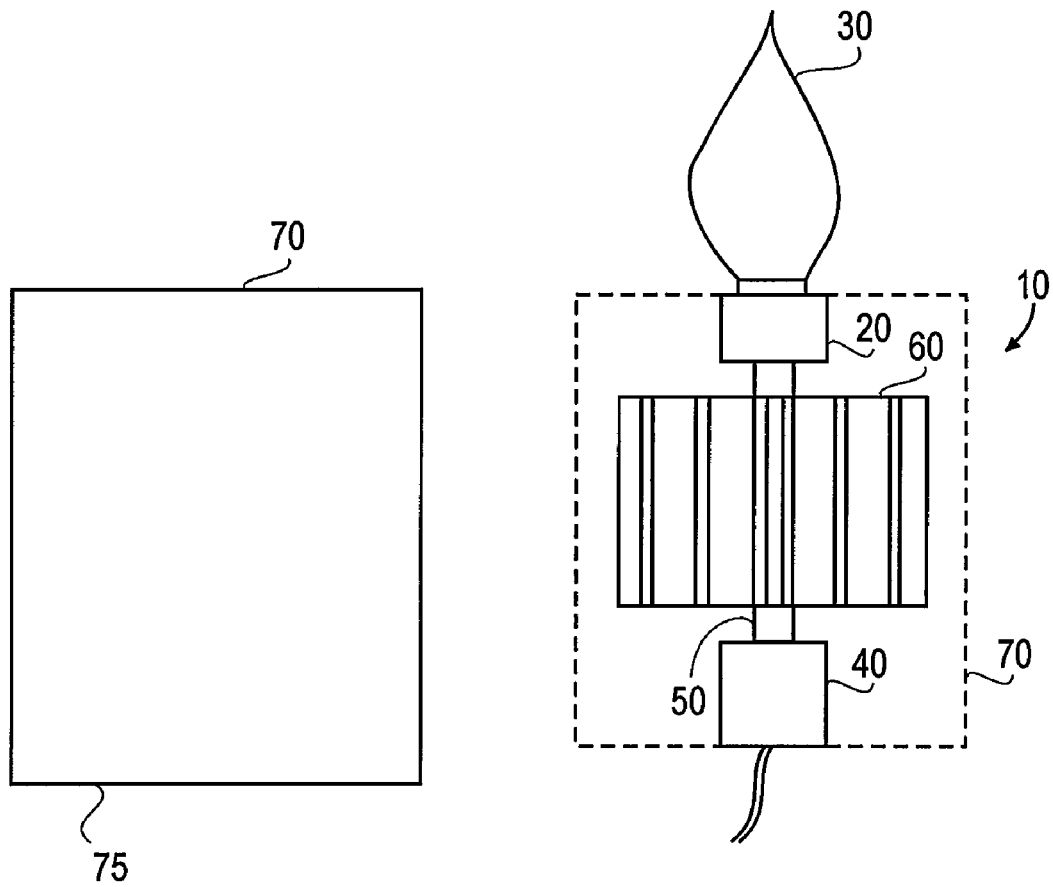
FIGS. 1A-1B are side and top views, respectively, of a heat sink apparatus for use with solid state lights in accordance with embodiments of the current invention.
Figure 1B:
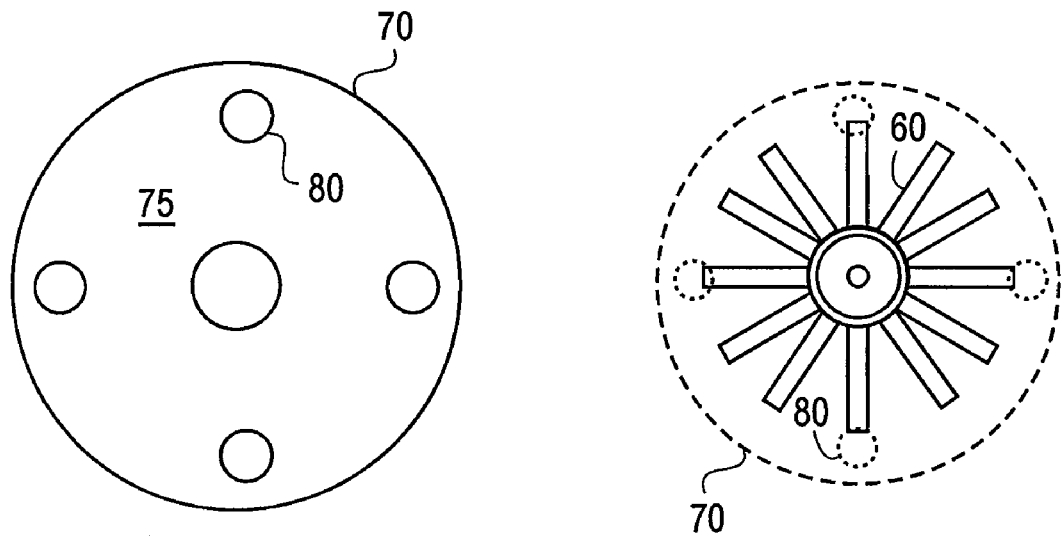

FIGS. 1A-1B are side and top views, respectively, of a heat sink assembly for use with solid state lights in accordance with embodiments of the current invention. The heat sink apparatus 10 includes a first end 20 with an attached solid state light 30, a second end 40, and an intermediate elongated portion 50. A number of fins 60 extend from the elongated portion 50.

FIGS. 1A-1B illustrate an embodiment in which the heat sink apparatus 10 of the invention is arranged in a generally vertical configuration. In the operation of this embodiment, the fins 60 of the heat sink apparatus 10 provide added surface area available for convective heat transfer. That is, heat from the solid state light 30 is transferred to the fins 60, heating the fins. Air warmed by heat from the fins 60 rises, generating air flow across the fins 60 in the vertical direction (i.e., from the second end 40 to the first end 20) and increasing the amount of heat dissipated from the solid state light 30. Thus, the addition of heat sink apparatus 10 to solid state light 30 allows for more heat to be dissipated from solid state light 30, in turn allowing for brighter and more efficient solid state lights 30. One of ordinary skill in the art will realize that it is desirable for the fins 60 to be arranged so as to maximize the amount of surface area available for convective heat transfer. Accordingly, in the generally vertical configuration of FIGS. 1A-1B, it is desirable for the fins 60 to extend generally radially from the elongated portion 50, as shown.

The heat sink apparatus 10 can also include an optional sleeve 70 that can be affixed to (or otherwise extend from) the second end 40, so as to protect the fins 60 from damage as well as to channel air (or another suitable fluid medium) across the fins 60. In FIGS. 1A-1B, the sleeve 70 is shown in solid lines on the left as separate from the heat sink apparatus 10, and in dashed lines on the right as installed on the heat sink apparatus 10. The sleeve 70 can include a bottom portion 75 with holes 80 to allow for air flow across the fins 60. As above, the sleeve 70 is optional and the invention contemplates embodiments that both include and exclude such a sleeve 70. Furthermore, the holes 80 need not be limited to circular holes, as shown. The invention includes any arrangement and configuration of holes 80. Additionally, the bottom portion 75 can be open, with sleeve 70 attached to second end 40 by struts, flanges, or the like, rather than by a bottom portion 75.

Figure 2:
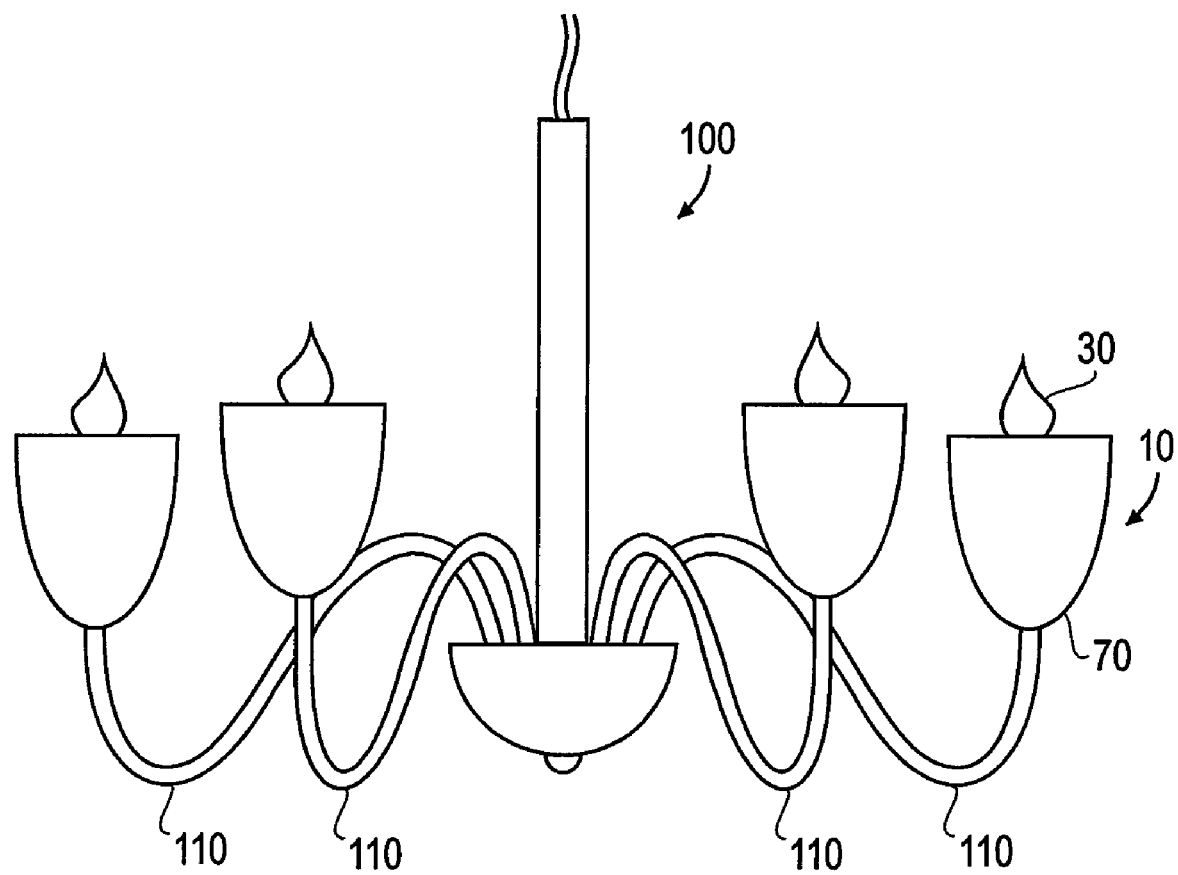
FIG. 2 is a side view of an exemplary chandelier, illustrating use of the heat sink apparatus of FIGS. 1A-1B.

One of ordinary skill in the art will observe that the heat sink apparatus 10 can be configured for use with conventional solid state lights such as LED light bulbs, in many of the same contexts. As one example, the heat sink apparatus 10 can be employed with solid state lights and light fixtures used in typical home and business environments. One such light fixture is shown in FIG. 2, which is a side view of an exemplary chandelier employing the heat sink apparatus of FIGS. 1A-1B. Chandelier 100 contains a number of arms 110, each supporting a heat sink apparatus 10 in the same manner it would a conventional light bulb. From FIG. 2, it can be observed that the heat sink apparatus 10 can be used in conjunction with almost any conventional solid state light, including those used with many common consumer applications.

While the heat sink apparatus 10 is illustrated in FIGS. 1A-1B as having a flat bottom portion 75, it can be observed that the bottom portion 75 can be of any shape and configuration compatible with a heat sink. In particular, the bottom portion 75 can be rounded, as shown in FIG. 2.

Figure 3A:
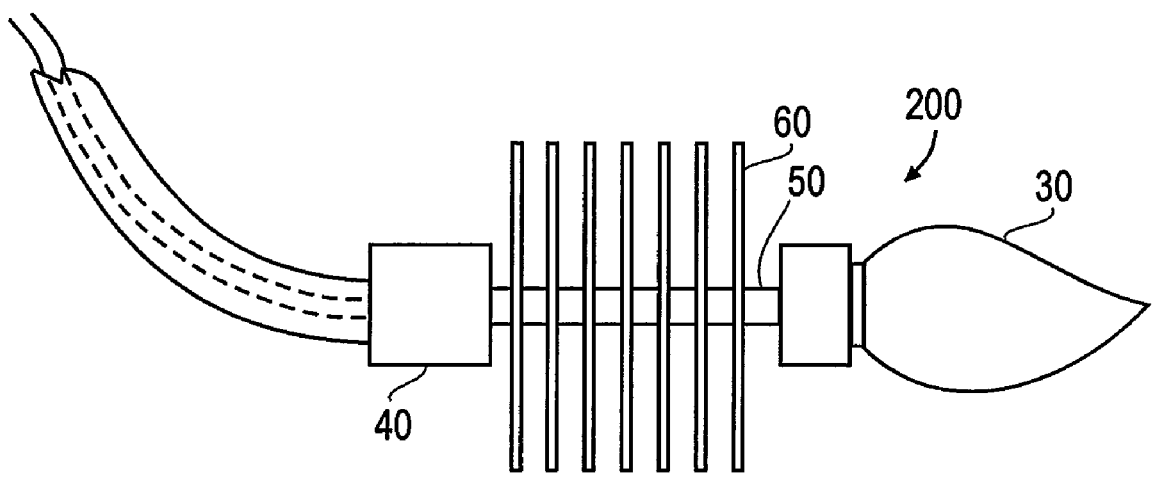
FIGS. 3A-3C are side, bottom, and top views, respectively, of a heat sink apparatus for use with solid state lights in accordance with further embodiments of the current invention.
Figure 3B:
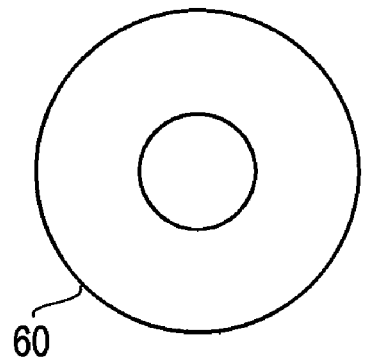
Figure 3C:
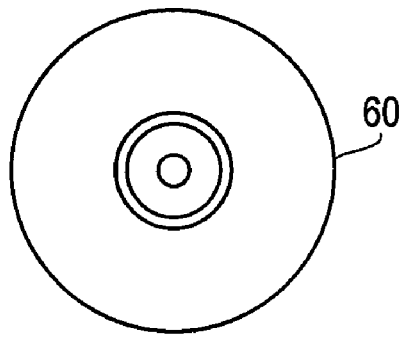

One of ordinary skill in the art will realize that the invention is not limited to the generally vertical configuration of FIGS. 1A-1B, but rather encompasses heat sinks that can be oriented in any manner, so long as they are still able to dissipate heat from their associated solid state lights. In particular, the invention includes generally horizontal heat sink configurations. FIGS. 3A-3C are side, bottom, and top views, respectively, of a heat sink apparatus for use with solid state lights in accordance with further embodiments illustrating such horizontal configurations. Here, heat sink apparatus 200 includes generally the same configuration of elements as the heat sink apparatus of FIGS. 1A-1B, except that the fins 60 extend generally circumferentially from the elongated portion 50. Such circumferentially arranged fins 60 maximize the amount of surface area exposed to rising air (or other appropriate fluid medium) when the heat sink apparatus 200 is oriented horizontally, thus maximizing the amount of heat dissipated from the solid state light 30.

Figure 4A:
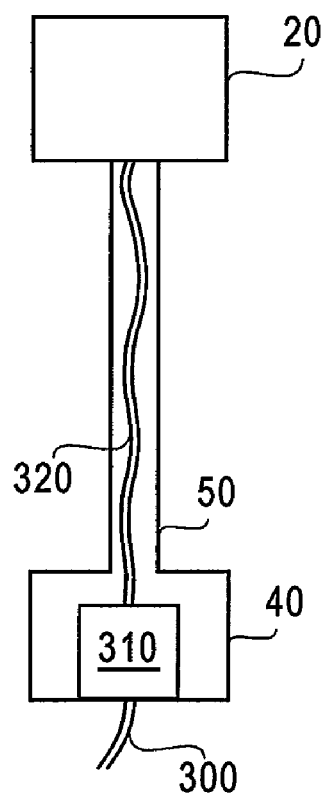
FIGS. 4A-4B are cutaway side views illustrating details of heat sink apparatuses of the current invention.

One of ordinary skill in the art will also observe that the invention includes configurations in which the solid state light 30 is separate from the heat sink apparatus 10, as well as configurations in which the solid state light 30 is integrally formed with the heat sink apparatus 10. FIG. 4A is a cutaway side view of heat sink apparatus 10, illustrating the former configuration. For clarity in explanation, fins 60 and solid state light 30 are not shown. In the configuration of FIG. 4A, the first end 20 is configured to be compatible with a separate solid state light 30. For example, the interior of first end 20 can be sized and threaded to allow a standard solid state light to be screwed in. That is, the first end 20 can be configured as a screw base for accepting the cap or sleeve of any commercially-available solid state light. Alternatively, the first end 20 can be configured with a conventional socket, where the solid state light is threaded into the socket. In either case, the invention contemplates heat sinks capable of connecting to any known solid state light. For instance, the invention includes first ends 20 sized and threaded for, or configured with a socket for, accepting a solid state light with any Edison screw base. In particular, it is contemplated that heat sink apparatuses 10 employed in the United States can be configured to accept any one or more of E5, E10, E11, E12, E17, E26, E26D, E29, and E39 screw bases, BA15S and BA15D bayonet bases, and G4 and GY6.35 bi-pin bases, while heat sink apparatuses 10 employed in other locations, including Europe, can be configured to accept any one or more of E10, E11, E14, E27, and E40 screw bases, BA15S and BA15D bayonet bases, and G4 and GY6.35 bi-pin bases.

The configuration of FIG. 4A can also include a power cord 300 extending from a power source, a driver 310 for converting power to levels appropriate for the particular solid state light 30 employed, and a power line 320 running from the driver 310 and supplying power to the solid state light. If the first end 20 is configured with a socket, the power line 320 is connected to the socket. If the first end 20 is configured to directly accept a solid state light 30, the power line 320 can connect directly to the solid state light 30. The driver 310 can be any device or circuitry for converting electrical power to appropriate levels, and can be located either in (or attached/proximate to) the second end 40 or remotely, such as within the body of chandelier 100. If the driver 310 is located remote from the remainder of the heat sink apparatus 10, the power line 320 may not be necessary, and the power cord 300 can instead run directly to the first end 20.

Figure 4B:
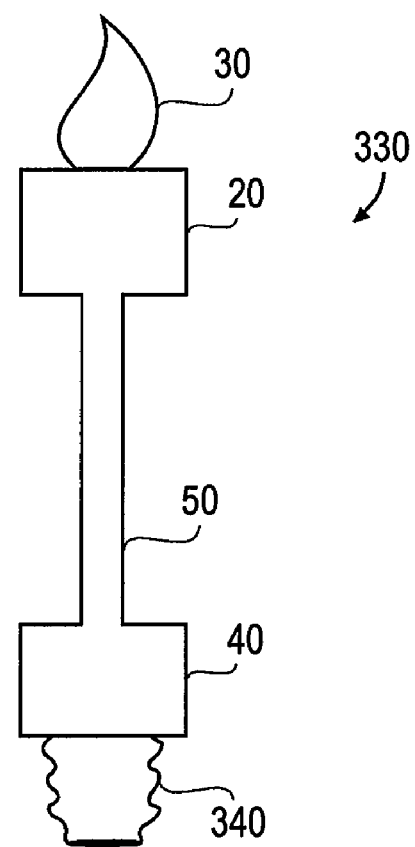

FIG. 4B is a cutaway side view of heat sink apparatus 330, illustrating the latter of the configurations described above, in which the solid state light 30 is integrally formed with the heat sink apparatus 10. As in FIG. 4A, fins 60 are not shown, for clarity in explanation. In the configuration of FIG. 4B, the first end 20 is integrally formed with a solid state light 30, so that the solid state light 30 itself does not have a screw base. Instead, a screw, bayonet or bi-pin base 340 extends from the second end 40, so that the entire heat sink apparatus 330 is configured to be installed into a light socket. As with the screw, bayonet and bi-pin bases described above, screw, bayonet or bi-pin base 340 can be any conventional lamp base, including an Edison screw base such as any of those listed above.

The foregoing description, for purposes of explanation, used specific nomenclature to provide a thorough understanding of the invention. However, it will be apparent to one skilled in the art that the specific details are not required in order to practice the invention. In other instances, well known devices are shown in block form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed. Rather, many modifications and variations are possible in view of the above teachings. For example, the invention contemplates heat sinks adapted for connection to and/or use with any solid state light, including LED lights. The invention also contemplates heat sinks configured as a separate component from a solid state light, as well as heat sinks formed as integral units with solid state lights. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A heat sink apparatus for a solid state light, comprising:
   a heat sink comprising:
      a first end including an electrical socket configured for connection to a separate solid state light, wherein the solid state light is adapted to be threaded into the electrical socket;
      a second end opposite the first end;
      a heat dissipating portion positioned between the first end and the second end; and
      a driver for the solid state light, the driver in electrical communication with the electrical socket and the first end so as to apply power to the solid state light;
   wherein the heat dissipating portion has an elongated element and a plurality of fins for dissipating heat generated by the solid state light, the fins extending from the elongated element.

2. The heat sink apparatus of claim 1, further comprising a sleeve extending from the second end and surrounding the fins.

3. The heat sink apparatus of claim 1, wherein the second end further comprises a base configured to be mated with an electrical socket, and wherein the base is at least one of a screw base, bayonet base, and bi-pin base.

4. The heat sink apparatus of claim 1, wherein the electrical socket is at least one of a screw base socket, bayonet base, and bi-pin base.

5. The heat sink apparatus of claim 1, wherein each fin of the plurality of fins extends radially from the elongated element.

6. The heat sink apparatus of claim 1, wherein each fin of the plurality of fins extends circumferentially from the elongated element.

7. The heat sink apparatus of claim 1, wherein the driver is proximate to the second end.

8. The heat sink apparatus of claim 1, wherein the driver is remote from the heat sink.

9. The heat sink apparatus of claim 1, wherein the solid state light is a LED light.

10. A solid state light assembly, comprising:
a solid state light;
a heat sink including an electrical socket configured to be affixed to the solid state light, wherein the solid state light is separate from the heat sink and is adapted to be threaded into the electrical socket; and
a driver for the solid state light, the driver in electrical communication with the electrical socket so as to apply power to the solid state light;
wherein the heat sink comprises at least one heat sink fin for dissipating heat from the solid state light.

11. The heat sink apparatus of claim 10, wherein the electrical socket is configured to accept the solid state light with at least one of a screw base, bayonet base, and bi-pin base.

12. The solid state light assembly of claim 10, wherein the heat sink has a first end and an opposite second end, wherein the solid state light is affixed to the first end, and wherein the second end has a lamp base for connection to an electrical socket.

13. The heat sink apparatus of claim 12, wherein the lamp base is at least one of a screw base, bayonet base, and bi-pin base.

14. The solid state light assembly of claim 10, wherein each fin of the at least one heat sink fin extends generally radially from the heat sink.

15. The solid state light assembly of claim 10, wherein each fin of the at least one heat sink fin extends generally circumferentially from the heat sink.

* * * * *